United States Patent [19]

Bruns et al.

[11] Patent Number: 4,941,942
[45] Date of Patent: Jul. 17, 1990

[54] METHOD OF MANUFACTURING A MASK SUPPORT OF SIC FOR X-RAY LITHOGRAPHY MASKS

[75] Inventors: Angelika M. Bruns, Henstedt-Ulzburg; Margret Harms, Hamburg; Holger K. G. Luthje, Halstenbek; Bernd Matthiessen, Seevetal, all of Fed. Rep. of Germany

[73] Assignee: U.S. Philips Corporation, New York, N.Y.

[21] Appl. No.: 251,630

[22] Filed: Sep. 29, 1988

[30] Foreign Application Priority Data

Oct. 2, 1987 [DE] Fed. Rep. of Germany ....... 3733311

[51] Int. Cl.$^5$ ............................................. B44C 1/22
[52] U.S. Cl. .................................... 156/657; 156/662; 156/644; 430/5; 430/65; 430/329; 427/249; 427/255; 427/255.2
[58] Field of Search ..................... 378/35; 430/5, 329; 156/662, 644, 659.1, 657; 148/D 133; 427/249, 255.2, 255; 437/22, 100

Primary Examiner—Thurman K. Page
Assistant Examiner—Jackie Weddington
Attorney, Agent, or Firm—Paul R. Miller

[57] ABSTRACT

A method of manufacturing a mask support or diaphragm of SiC for X-ray lithography masks is set forth in which a SiC layer is deposited by means of chemical vapor deposition (CVD) on a substrate in the form of a monocrystalline silicon wafer on at least one of the two major surfaces of the monocrystalline silicon wafer, after which the monocrystalline silicon wafer is removed except an edge region in a selective etching step. According to the invention the following processing steps are used:

(a) deposition of the SiC layer with the monocrystalline silicon wafer first being heated in the apparatus provided for the deposition process to a temperature in the range of 1000° to 1350° C. in a H$_2$ atmosphere and then being etched by a suitable etchant and subsequently being rinsed under the influence of H$_2$, whereupon the SiC layer is provided from a gas atmosphere containing silicon and hydrocarbons, after which the coated substrate is cooled in a H$_2$ atmosphere to ambient temperature, and (b) implantation of ions into the SiC layer for mechanically disturbing the crystal structure of the SiC layer.

16 Claims, 2 Drawing Sheets

METHOD OF MANUFACTURING A MASK SUPPORT OF SIC FOR X-RAY LITHOGRAPHY MASKS

The invention relates to a method of manufacturing a mask support or membrane of SiC for X-ray lithography masks, in which an SiC layer is deposited by means of chemical vapour deposition (CVD) on a substrate in the form of a monocrystalline silicon wafer on at least one of the two major surfaces of the monocrystalline silicon wafer, after which the monocrystalline silicon wafer is removed except an edge region by means of a selective etching step.

The publication by E. Spiller and R. Feder "X-ray lithography" in "Topics in current physics: X-ray optics", Springer, New York 1977, pp. 35 to 92 shows what meaning X-ray lithography has for the manufacture of, for example, semiconductor systems or magnetic cylinder domain arrangements because especially in these manufacturing processes there is an increasing interest for structures becoming increasingly smaller, i.e. in the micron or nm range. For all methods with high resolution, accurate and very precisely defined masks are required. The efficiency of the X-ray lithography becomes clear with reference to the minimum width of the structures that can be attained with it: light lithography $\approx 2$ to 3 $\mu$m, electron beam lithography $\approx 0.05$ to 0.1 $\mu$m, X-ray lithography $<500$ nm.

The use of X-rays for exposing a lacquer to be structured affords the advantage that disturbing diffraction phenomena during the projection of the mask structure onto the lacquer layer are reduced.

For exposure with X-rays, specific irradiation masks for structuring the lacquer are required. Such a mask consists of the pattern of the structure to be manufactured made of a material strongly absorbing X-rays (absorber), the absorber pattern being provided on a thin membrane of a material as highly transparent as possible to X-rays.

For the absorber, materials having a highest possible atomic weight are suitable; and practice, for example, gold, molybdenum or tungsten have proved to be satisfactory.

As a material for the membrane, practically all the materials are suitable which are sufficiently transparent to X-rays. Since, however, in the X-ray range no material is completely transparent and no material is completely opaque, the diaphragm should be comparatively thin in order to guarantee a highest possible transparency to X-rays; and the absorber pattern should be comparatively thick in order to ensure a highest possible absorption of X-rays.

By a suitble choice of the materials and of the manufacturing processes, it must be ensured on the other hand that the masks are sufficiently transparent both with respect to the X-ray radiation (comparatively soft X-ray radiation having a wavelength in the range of $\lambda = 0.5$ to 2 nm) and with respect to the radiation from the visible range of the spectrum required for adjustment. The thickness of the membrane, which is limited thereby lies in the range of a few microns. On the other hand, the masks must have a sufficient contrast for structure multiplication. Since also heavy elements, from which the absorber structures are formed, at any rate are not completely opaque with respect to X-ray radiation, the absorber structures must generally be applied in a thickness of substantially 1 $\mu$m. Great difficulties are already involved in realizing these conditions for the manufacturing technique.

The increasingly smaller size of the structures of elements manufacured by means of X-ray lithography moreover requires masks whose accuracy to size is allowed to fluctuate within very narrow tolerance limits ($\leq 100$ nm). Thus, the manufacturing technique meets great problems because these narrow tolerance limits must be maintained in spite of many greatly different processing steps for the manufacture of the masks and also during a long life of the masks with up to $10^6$ exposures per mask with intense X-ray irradiation. These requirements show the major importance of the mechanical stability of the membrane.

The mechanical stability of a membrane can be characterized by its elasticity module. The following table indicates the elasticity module and further properties of different known diaphragm materials.

| Material | Thermal expansion ($K^{-1}$) | Elasticity module ($N/m^2$) | Refractive index | Density ($g/cm^3$) |
|---|---|---|---|---|
| SiC | $4{,}7 \cdot 10^{-6}$ | $4{,}57 \cdot 10^{11}$ | 2,48 | 3,2 |
| Si | $2{,}6 \cdot 10^{-6}$ | $1{,}62 \cdot 10^{11}$ | 3,9 | 2,42 |
| Si$_3$N$_4$ | $2{,}7 \cdot 10^{-6}$ | $1{,}55 \cdot 10^{11}$ | 2,2 | — |
| BN | $1 \cdot 10^{-6}$ | $1{,}33 \cdot 10^{11}$ | 2,0 | 2,34 |
| Be | $12{,}3 \cdot 10^{-6}$ | $3{,}02 \cdot 10^{11}$ | — | 1,85 |
| Mg | $26 \cdot 10^{-6}$ | $0{,}45 \cdot 10^{11}$ | — | 1,74 |
| Ti | $9 \cdot 10^{-6}$ | $1{,}1 \cdot 10^{11}$ | — | 4,52 |

It appears from the table that SiC is a particularly suitable material for membranes or X-ray lithography masks because of its high elasticity module, but also because of its optical properties.

Beside the required mechanical rigidity, however, the topography (surface roughness or peak-to-valley height) and induced voltages also play an essential part. By known coating methods of manufacturing SiC layers, it has not been hitherto possible to obtain a small tensile stress required for optimum SiC membrane beside a small peak-to-valley height during the manufacture of the diaphragms.

U.S. Pat. No. 3,873,824 discloses a mask for X-ray lithography having a mask support of SiC on a body of preferably silicon.

The mask support manufactured by means of the known method still has too large a peak-to-valley height and too high a tensile stress, however.

The invention has for its object to provide a method of manufacturing SiC diaphragms, which leads not only to smooth SiC membranes, but also to SiC membranes, which, as desired, have little stress and are highly transparent in the range of the visible spectrum.

According to the invention, this object is achieved in that a method is used characterized by the following processing steps:

(a) deposition of the SiC layer, the monocrystalline silicon wafer being first heated up in the apparatus provided for the deposition process to a temperature in the range of from 1000° to 1350° C. in a H$_2$ atmosphere and then being etched by means of a suitable etchant and subsequently being rinsed under the influence of H$_2$, whereupon the SiC layer is provided from a gas atmosphere containing silicon and hydrocarbons, after which the coated substrate is cooled to ambient temperature in a H$_2$ atmosphere, and (b) implantation of ions into the SiC layer for mechanically disturbing the crystal structure of the SiC layer.

By means of the first processing step according to (a), due to the chosen reaction temperature SiC layers having a high tensile stress in the range of $\times .10^8$ N/m$^2$ and a small peak/to-valley height in the nm range are attained, while by means of the further processing step according to (b) due to the implantation of ions mechanically disturbing the crystal structure of the SiC layer the tensile stress values can be adjusted in a range of $\times .10^7$ N/m$^2$.

According to an advantageous further embodiment of the method in accordance with the invention, the monocrystalline silicon wafer is heated to a temperature of 1110° C.

According to further advantageous embodiments of the method according to the invention, as reaction gas for the deposition of the SiC layer use is made of 0.05 to 8.0%, preferably 1.4%, of dichlorodimethyl silinate $(CH_3)_2SiCl_2$ in hydrogen $H_2$ plus 15% of propane related to dichlorodimethyl silane or silane $SiH_4$ with toluene $C_7H_8$ or silane $SiH_4$ with propane $C_3H_8$.

According to further advantageous embodiments of the method in accordance with the invention, boron ions are implanted at a dose of $10^{15}$ to $10^{16}$/cm$^2$, preferably $10^{16}$/cm$^2$, at an implantation energy in the range of 150 to 400 keV, preferably of 170 keV, or carbon ions are implanted at a dose of $10^{15}$ to $5.10^{16}$/cm$^2$, preferably $10^{16}$/cm$^2$, at an implantation energy in the range of 150 to 400 keV, preferably 400 keV, or nitrogen ions are implanted at a dose of $10^{15}$ to $5.10^{16}$/cm$^2$, preferably $2.10^{16}$/cm$^2$, at an implantation energy in the range of 150 to 400 keV, preferably 400 keV.

The advantages that can be obtained by the use of the invention more particularly consist in that SiC layers having a small peak-to-valley height and at the same time a reduced tensile stress can be manufactured in a reproducible manner and with stress values that can be adjusted in a defined manner. A further great advantage in an economical respect resides in the fact that both the CVD process used for the manufacture of the SiC layer and the ion implantation process used for the reduction of the stress within the SiC layer can be carried out by means of machines that are commerically available.

Embodiments of the invention will be described and their operation will be explained with reference to the drawing. In the drawing:

BRIEF DESCRIPTION OF THE DRAWINGS

FIG. 1 shows diagrammatically the cycle of the manufacturing process for an SiC diaphragm comprising the processing steps (a) to (d).

Figure 1A:
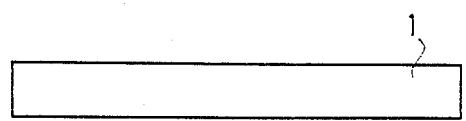
FIG. 1 shows the diagrammatic representation of the cycle of the process of coating a substrate with an SiC layer and of forming an SiC membrane after removal of a part of the substrate.
Figure 1B:
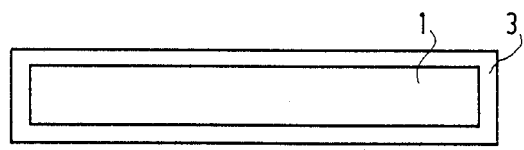
Figure 1C:
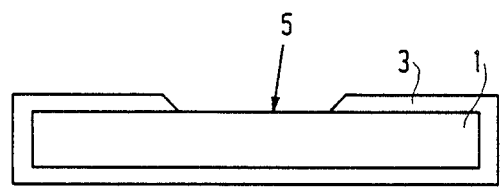
Figure 1D:
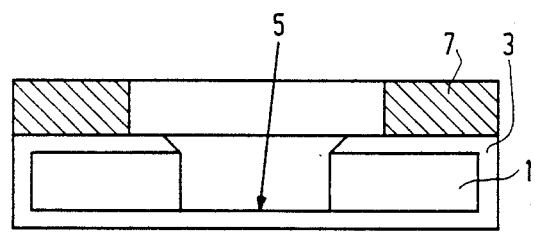

As the substrate 1 use is made of a commercially available monocrystalline silicon wafer with [100] orientation, on which is deposited on all sides a 2.5 μm thick SiC layer 3 (FIGS. 1a, 1b). The desired membrane area 5 is defined by a mechanical mask (not shown) and the SiC layer 3 is removed at this area by reactive ion etching in SF$_6$ atmosphere (FIG. 1c). The substrate 1 is then removed at the membrane area 5 by a wet chemical treatment in a selectively acting etchant (KOH). The finishing takes place by adhering the etched substrate 1 onto a 5 mm thick ring 7 (FIG. 1d).

Since the quality of the membrane is influenced mainly by the coating process, the SiC deposition is of major importance. Besides the desired mechanical rigidity, further criteria essential to the use as a mask are given by the stress and the topography (peak-to-valley height) of the SiC layer. It has been found that with a sufficient concentration of silicon and hydrocarbons in the reaction gas (for example dichlorodimethyl silane $(CH_3)_2SiCl_2$ and propane $C_3H_8$ in $H_2$ as carrier gas) the layer properties can be considerably influenced by the coating temperature and by the quantity of propane participating in the process and serving as caarbon source. This situation has been shown in FIG. 2 with reference to the layer stress. With increasing temperature a reduction of the tensile stress takes place towards and opposite compressive stress. In general, the temperature for obtaining SiC layers having little stress is shifted with an increasing propane content to lower ranges. Comparable result were obtained with silane $SiH_4$ and toluene $C_7H_8$ and with silane $SiH_4$ and propane $C_3H_8$, respectively.

Figure 2:
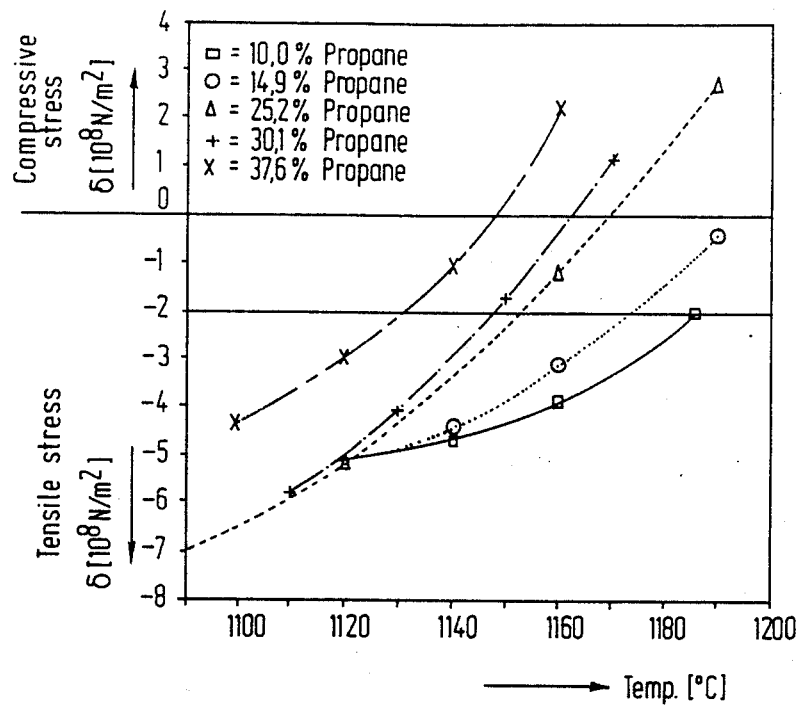
FIG. 2 shows a diagram of the stress in SiC layers obtained by means of the present method as a function of the reaction temperature and of the propane content in the gas atmosphere.

An analysis of layers to be assigned to the tensile stress range of FIG. 2 leads unambiguously to the recommendation of the use of a polycrystalline structure, which is substantially β-orientated. The hydrogen and chlorine concentration ws in all cases lower than 3 at. %, independently of the propane content. The elasticity module was determined at $4.6.10^{11}$ N/m$^2$. With respect to the optical transparency, there were measured in the wavelength range between 700 and 800 nm 2.5 μm thick layers having optical transparency values of more than 50%, which can be increased by an anti-reflection coating to well over 80%.

Figure 3:
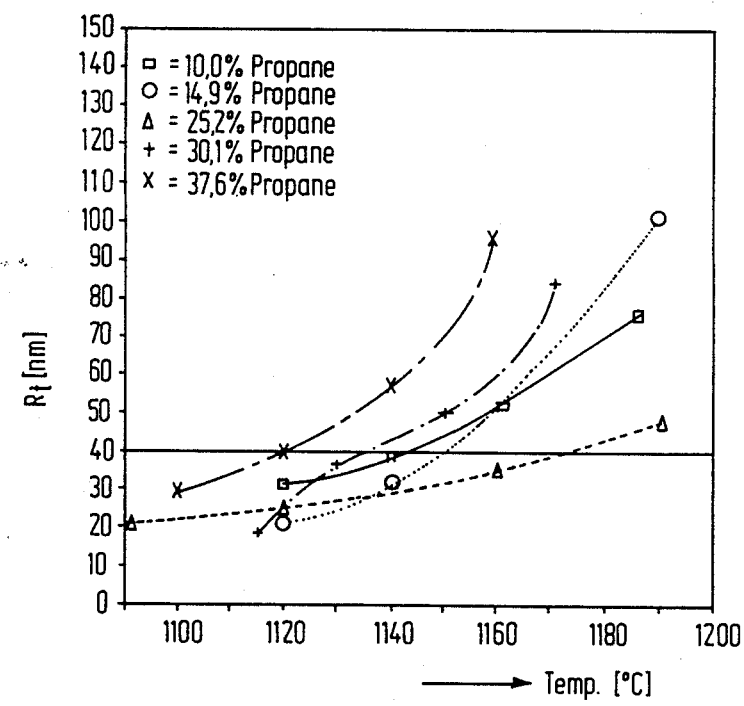
FIG. 3 shows a diagram of the peak-to-valley height of SiC layers obtained by means of the present method as a function of the reaction temperature and of the propane content in the gas atmosphere.

Since a surface roughness (peak-to-valley height) is related to the polycrystalline structure of the SiC layer, this property was also thoroughly examined. The peak-to-valley height ($R_t$) determined mechanically by means of a scanning system is plotted in FIG. 3 against the reaction temperature. Also in this case, a considerable influencing of the $R_t$ values by the reaction temperature and the propane content appears. Since optimization of the CVD process must take place with a view both to a small tensile stress ($\delta \approx 5.10^7$ N/m$^2$) and to a small peak-to-valley height ($R_t \approx 20$ nm), either only comparatively rough layers considerably limiting the adjustment and structure quality of the mask or smooth layers ($R_t \approx 10$ nm) can be manufactured with a compartively high tensile stress ($\delta \approx 5.10^8$ N/m$^2$). In the second case, beside a small yield of mask supports (diaphragms) the unevenness of these diaphragms determined by the tensile stress especially a disadvantageous effect. A further disadvantage resides in the substantial spread of the tensile stress values in the range $\delta < 10^8$ N/m$^2$.

In order to obtain both SiC layers which are smooth and which are substantially free of stress, the membrane according to the invention is manufactured in two processing steps, in which event, however, in the first step an SiC layer 3 (cf. FIGS. 2 and 3) with a high tensile stress, but with a very small peak-to-valley height is deposited on the monocrystalline silicon wafer 1, and is adjusted in the second processing step by means of an ion implantation process by a suitable process control with respect to the mechanical stress. The layer stress is therefore adjustable in a defined manner independently of the parameters for deposition of the layer.

For the manufacture of a 2.5 μm thick SiC layer, the following conditions are used:
1. heating the substrate in the form of a 100 orientated monocrystalline silicon wafer to a temperature of 1110° C. in $H_2$ atmosphere,
2. etching the sbustrate in HCl for a duration of 4 minutes,
3. rinsing the etched substrate in $H_2$ for a duration of 4 minutes,
4. depositing SiC from a reaction gas containing 14% of dichlorodimethyl silane $(CH_3)_2SiCl_2$ in $H_2$ carrier gas plus 15% of propane related to dichlorodimethyl silane, where the deposition duration is 60 s,
5. cooling to ambient temperature in $H_2$ atmosphere.

The SiC layer thus manufactured has a peak-to-valley height $R_t$20 nm. The tensile stress determined through the deformation of the substrate is $\approx 4.10^8$ N/m$^2$.

After the coating step, the substrate is doped with boron with the use of a high-current ion implantation equipment. Beside the implantation with boron, also experiments with nitrogen, argon and carbon were carried out. In all cases, an influence on the tensile stress of the SiC layer could be observed.

| Implantation data for boron | |
|---|---|
| tensile stress of the deposited SiC layer | $4.10^8$ N/m$^2$, |
| implantation energy | 170 keV, |
| dose | $10^{16}$/cm$^2$, |
| tensile stress of the implanted SiC layer | $2.10^7$ N/m$^2$. |
| Implantation data for carbon | |
| tensile stress of the deposited SiC layer | $4.4 \cdot 10^8$ N/m$^2$, |
| implantation energy | 400 keV, |
| dose | $10^{16}$/cm$^2$, |
| tensile stress of the implanted SiC layer | $8.10^7$ N/m$^2$. |
| Implantation data for nitrogen | |
| tensile stress of the deposited SiC layer | $4.10^8$ N/m$^2$, |
| implantation energy | 400 keV, |
| dose | $2.10^{16}$/cm$^2$, |
| tensile stress of the implanted SiC layer | $<10^8$ N/m$^2$. |

Moreover, the monocrystalline silicon wafer can be provided on all sides with an SiC layer, such that then first the central part of the monocrystalline silicon wafer not desired in accordance with the diaphragm to be manufactured with the SiC layer present on it is removed by a selective etching process and such that subsequently the desired ions are implanted into the remaining SiC layer, which is located opposite to the removed SiC layer and already represents the membrane. In this case, the ion implantation may also be effected, for example, from the back side of th membrane. When the substrate has been provided at its two major surfaces with an SiC layer, the ions provided for reducing the tensile stress are effectively also implanted into the two SiC layers present on the respective major surfaces of the substrate.

The monocrystalline silicon wafer can also be provided with an SiC layer at only one of its major surfaces and after implantation of the desired ions, either a disposed etching mask or a nitride mask provided by means of a deposition process from the gaseous phse is used before the partial removal of the silicon substrate by means of an etching process.

Instead of boron, carbon or nitrogen ions, silicon or hydrogen ions may also be implanted into the SiC layer.

The implantation data can be determined by a person skilled in the art within the scope of the present method in the range of the desired stress reduction.

What is claimed is:
1. A method of manufacturing a mask support or membrane of SiC for X-ray lithography masks comprising the steps of
  (a) heating a monocrystalline silicon wafer to a temperture in the range of from 1000° to 1350° C. in a $H_2$ atmosphere, said monocrystalline silicon wafer having two major surfaces,
  (b) then etching the heatd monocrystalline silicon wafer and subsequently rynsing the etched monocrystalline silicon wafer under the influence of $H_2$,
  (c) depositing a layer of SiC on the rinsed monocrystalline silicon wafer in a gas atmosphere of silicon and hydrocarbons, said layer of SiC coating at least one of said two major surfaces of said monocrystalline silicon wafer,
  (d) cooling the coated monocrystalline silicon wafer to ambient temperature in a $H_2$ atmosphere,
  (e) implanting ions into said layer of SiC for mechanically disturbing the crystal structure of said layer of SiC, and
  (f) selectively removing said monocrystalline silicon from said layer of SiC except at edges of said monocrystalline silicon wafer, thereby exposing both sides of said layer of SiC.

2. A method according to claim 1, wherein said step (c) is carried out by depositing said layer of SiC on both of said two major surfaces, and wherein said step (f) is carried out by first removing a portion of said layer of SiC from one of said two major surfaces to thereby expose a part of said monocrystalline silicon wafer, and then selectively etching said part of said monocrystalline silicon wafer through to the other of said two major surfaces to expose both sides of said layer of SiC.

3. A method according to claims 1 or 2, wherein said step (a) is carried out by heating said monocrystalline silicon wafer to a temperature of 1110° C.

4. A method according to claims 1 or 2, wherein said step (c) is carried out by using in said gas atmosphere 0.05 to 8.0% of dichlorodimethyl silane, $(CH_3)_2$ Si, $Cl_2$, in hydrogen, $H_2$, and 15% of propane, $C_3H_8$, related to dichlorodimethyl silane.

5. A method according to claim 4, wherein 1.4% of said dichlorodimethyl silane is used.

6. A method according to claim 4, wherein during said step (c) said layer of SiC is deposited to a thickness of 2.5 μm.

7. A method according to claim 6, wherein said step (e) is carried out by implanting boron ions into said layer of SiC at a dose of $10^{15}$ to $10^{16}$cm/$^2$ at an implantation energy in the range of from 150 to 400 keV.

8. A method according to claim 7, wherein said boron ions are implanted at a dose of $10^{16}$/cm$^2$ at an implantation energy of 170 keV.

9. A method according to claim 6, wherein said step (e) is carried out by implanting carbon ions into said layer of SiC at a dose of $10^{15}$ to $5 \times 10^{16}$/cm$^2$ at an implantation energy in the range of from 150 to 400 keV.

10. A method according to claim 9, wherein said carbon ions are implanted at a dose of $10^{16}$/cm$^2$ at an implantation energy of 400 keV.

11. A method according to claim 6, wherein said step (e) is carried out by implanting nitrogen ions into said layer of SiC at a dose of $10^{15}$ to $5\times10^{16}/cm^2$ at an implantation energy in the rangeof from 150 to 400 keV.

12. A method according to claim 11, wherein said nitrogen ions are implanted at a dose of $2\times10^{16}/cm^2$ at an implantation energy of 400 keV.

13. A method according to claims 1 or 2, wherein said step (c) is carried out by using silane, $SiH_4$, with toluene, $C_7H_8$, in said gas atmosphere.

14. A method according to claims 1 or 2, wherein said step (c) is carried out by using silane, $SiH_4$, with propane, $C_3H_8$, in said gas atmosphere.

15. A method according to claim 4, wherein said step (a) is carried out by heating said monocrystalline silicon wafer to a temperature of 1110° C.

16. A method according to claim 14, wherein said step (a) is carried out by heating said monocrystalline silicon wafer to a temperature of 1110° C.

* * * * *